United States Patent
Dooley

(10) Patent No.: US 7,818,096 B2
(45) Date of Patent: Oct. 19, 2010

(54) AIRBORNE ELECTRONICS HOUSING ASSEMBLY

(75) Inventor: Kevin Allan Dooley, Mississauga (CA)

(73) Assignee: Pratt & Whitney Canada Corp., Longueuil, Quebec (CA)

(*) Notice: Subject to any disclaimer, the term of this patent is extended or adjusted under 35 U.S.C. 154(b) by 856 days.

(21) Appl. No.: 11/420,923

(22) Filed: May 30, 2006

(65) Prior Publication Data

US 2008/0071430 A1 Mar. 20, 2008

(51) Int. Cl.
H04N 5/225 (2006.01)
H05K 7/20 (2006.01)
G06F 19/00 (2006.01)

(52) U.S. Cl. .................. 701/1; 701/3; 701/36; 361/348; 361/690

(58) Field of Classification Search ............ 701/1, 701/3, 36; 361/1, 348, 688, 691, 724; 363/141; 348/373
See application file for complete search history.

(56) References Cited

U.S. PATENT DOCUMENTS

| | | | | |
|---|---|---|---|---|
| 5,107,286 A | * | 4/1992 | Sergeant et al. | 396/26 |
| 5,801,632 A | * | 9/1998 | Opal | 340/585 |
| 5,814,765 A | | 9/1998 | Bauer et al. | |
| 5,852,754 A | * | 12/1998 | Schneider | 396/427 |
| 6,061,087 A | * | 5/2000 | Schieltz et al. | 348/151 |
| 6,180,875 B1 | | 1/2001 | Baur et al. | |
| 6,354,749 B1 | * | 3/2002 | Pfaffenberger, II | 396/427 |
| 6,944,022 B1 | * | 9/2005 | Kehret et al. | 361/690 |
| 2002/0140848 A1 | | 10/2002 | Cooper et al. | |
| 2008/0030951 A1 | * | 2/2008 | Hall et al. | 361/696 |

FOREIGN PATENT DOCUMENTS

DE    39 05 835 A1    8/1990

* cited by examiner

Primary Examiner—Tan Q Nguyen
(74) Attorney, Agent, or Firm—Ogilvy Renault LLP

(57) ABSTRACT

An aircraft electronics housing assembly maintains the electronics unit at given ambient conditions despite changes in conditions outside the housing during the aircraft flight cycle.

8 Claims, 3 Drawing Sheets

AIRBORNE ELECTRONICS HOUSING ASSEMBLY

TECHNICAL FIELD

This invention relates to the field of electronics components, and particularly chose suitable for use in aircraft and other airborne applications.

BACKGROUND OF THE INVENTION

Various electronics components are used for monitoring and operating aircraft and engine systems.

The electronics components are subject to environmental conditions such as reduced pressure, temperature, humidity, etc. relative to sea level conditions, and the cyclic conditions experienced as the aircraft takes-off, climbs, cruises, descends and landings, etc. Proper testing and regulatory certification (e.g. by the Federal Aviation Authority, etc.) is therefore required for ensuring these electronics components are safe for use in the conditions to which they are subjected on the aircraft.

Those additional, development and certification requirements typically result in more expensive electronics components. Certain types of electronic components, such as plastic packaged electronic devices, cannot be used reliably in aircraft, as they are not designed for the environment to which they would be subjected on the aircraft (e.g. the plastic package may leak allowing harmful water vapour or oxygen or other gases to contaminate the silicon die or internal connections, etc). Therefore, there is a need for improved solutions for providing and certifying airborne electronics.

SUMMARY OF THE INVENTION

According to an aspect, there is provided an aircraft electronics housing assembly for maintaining the electronics unit at given ambient conditions despite changes in conditions outside the housing assembly during the aircraft flight cycle.

According to another aspect, there is provided an aircraft electronics assembly comprising: an electronics unit; a housing for sealingly receiving therein the electronics unit and for maintaining substantially constant ambient conditions therein; and an ambient parameter data sensor for sensing an ambient parameter indicative of the ambient conditions.

According to yet another aspect, there is provided an aircraft electronics assembly comprising: an electronic unit; and means for controllably maintaining substantially constant ambient conditions around the electronic unit throughout a flight cycle of the aircraft.

According to still another aspect, there is provided a method for monitoring an aircraft-mounted electronics assembly, the method comprising: monitoring an ambient parameter inside the aircraft-mounted electronics assembly; detecting abnormal data of the monitored ambient parameter; and providing an error signal indicative of the detected abnormal data.

BRIEF DESCRIPTION OF THE DRAWINGS

Further features and advantages of the present invention will become apparent from the following detailed description, taken in combination with the appended drawings, in which.

It will be noted that throughout the appended drawings and description, like features are identified by like reference numerals.

DETAILED DESCRIPTION

Figure 1:
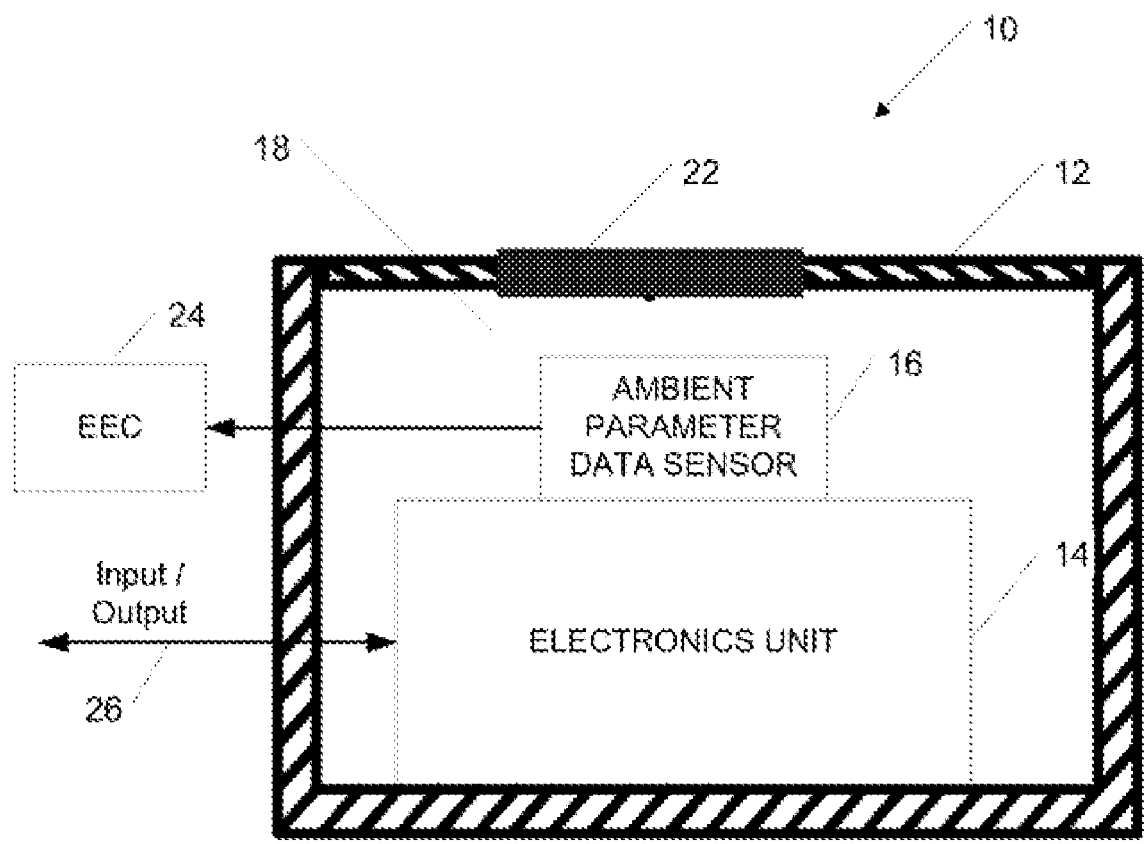
FIG. 1 is a diagram showing a cross-section side view of an aircraft electronics assembly according to an embodiment of the invention.

How referring to FIG. 1, there is shown an embodiment of an aircraft electronics assembly 10 according to the present invention. The aircraft electronics assembly 10 comprises a housing 12, an electronics unit 14, and one or more ambient parameter sensors 16, such as a pressure, temperature and/or humidity sensors. The aircraft electronics assembly 10 is mounted to an aircraft structure 20, such as an aircraft engine.

The housing 12 is adapted to receive and enclose the electronics unit 14 and the ambient parameter data sensor 16. Furthermore, the housing 12 is adapted to maintain therein given desired ambient parameters such as temperature, humidity and pressure, regardless of the conditions surrounding the housing 12. Parameters maintained within the housing 12 may be, for example, so-called standard temperature, pressure and humidity conditions (e.g. 20° C., 14.7 PSIA, 50% relative humidity). Accordingly, in an embodiment, the housing 12 is suitably sealed. The aircraft electronics assembly 10 may include a heat exchanger 22, such as a fluid cooled heat exchanger 22, which has a cooling fluid flowing in is to remove the heat from the housing 12 so thereby help maintain internal temperature conditions (heating may also be advantageously applied). In an embodiment, an output (not shown) from the ambient parameter data sensor sends at least one of the ambient parameters to the noun exchanger 22 for the purpose of controlling it.

The housing 12 is made of suitable, and, in an embodiment, lightweight, material such as aluminum or a composite material.

The electronics unit 14 may include any type of electronics component, assembly of electronics components or the like. For instance, the electronics unit 14 may be one or more of a processor, dedicated circuit, memory unit such as ROM/RAM, transistor, relay, motherboard, computer, or the like. In one embodiment, the electronics unit 14 comprises power control circuitry or power control unit (PCU) for an aircraft generator, and/or starter motor control circuitry for an aircraft engine starter, and/or engine or aircraft health monitoring circuitry and systems. The electronics unit thus has an input/output 26 for communicating wish entities external housing 12, such as aircraft systems (e.g., electronics, avionics or others).

It will be appreciated that, in light of the disclosure herein, the electronics unit 14 may include any unit that is certified to be used in a reference environment, as long as chat reference environment is reliably maintained inside the housing 12. Thus, for example, electronics units using components mass-produced for less demanding ground-based applications (e.g., personal computing devices or automotive electronics, to name just a couple of the many possibilities) may be reliably used within the controlled environment of the housing 12. The skilled addressee will appreciate that the housing-plus-electronics unit assembly will still require certification to be considered flight-worthy. The aircraft electronics assembly 10 permits electronics components to be employed which are not themselves certifiable, and thus gives the designer access to consumer- and commercial-grade electronics and components which, for reasons of simplicity of design and economies of scale, tend to be less expensive than a component which is specially designed to be stand-alone certified for high altitude use in aircraft.

The ambient parameter sensor 16 is adapted to provide data indicative of at least one corresponding ambient parameter to be monitored. As explained below, the ambient parameter data may be provided through an output to a monitoring unit, such as an engine electronic: controller (EEC) 24, located outside the housing 12. Pressure may be monitored directly, to enable the integrity of the sealing of housing 12 to be monitored. Temperature sensors, humidity sensors and the like may also be provided to monitor conditions inside the housing 12, monitor the health of the heat exchanger 22, etc. In an embodiment, pressure is monitored, since the continued and specified operation of the electronics unit 14 inside of housing 12 must be protected. If a leak is detected, a pressure drop will be decocted, and she aircraft users will be notified that service action is required. This may be done at the earliest opportunity. To assist in certification of the housing-plus-electronics assembly, the electronics unit 14 provided in housing 12 may not be so sensitive to pressure, temperature, etc. that it cannot function for limited periods of time, should the pressure seal of housing 12 fail. In other words, in an embodiment, a seal failure of housing 12 would not pose a safety-of-flight issue, nor an emergency maintenance issue, but rather simply a maintenance issue which should be attended to as soon as practical.

In another aspect, temperature may be monitored to monitor the integrity of the sealing of housing 12. In another aspect, housing 12 is initially evacuated, and filled with at gas of known content and, in an embodiment, of a content different from the gas or gases which surround the housing when in operation. A sensor inside the housing monitoring gas content will detect a change in composition indicative of a leak which permits surrounding gas or gases to enter the housing.

In another aspect, ambient condition monitoring may indicate other types of failure. For example, if the pressure rises above a certain limit, it may be an indication of failure of an internal component, such as a capacitor that may generate gases on failure. Pressure may be sensed using a pressure sensor or barometer.

In another aspect, temperature monitoring (using thermometer) say be used to indicate the health of heat exchanger 22, and/or the health of the pressure seal of housing 12. Temperature rise above a certain threshold may indicate a deficiency in the heat exchanger 22, while temperature change below (or above) a certain temperature may also indicate that outside air has leaked in, and thus cooled (or heated), the housing interior.

In another aspect, a humidity sensor may be used to monitor humidity and hence to monitor the health of the pressure seal of housing 12, Humidity deviating from a desired range may indicate that outside air has leaked into/out of the housing interior.

In another aspect, the molecular content of the gas inside the housing is monitored in some respect, such as with an appropriate sensor (e.g., a gas molecular content sensor), to monitor the health of the pressure seal of housing 12. For example, the presence of oxygen may indicate a leak, if the infernal environment of housing 12 was evacuated of oxygen during assembly.

In providing the housing 12, once the desired components are provided therein, the housing may then be flushed out with an inert dry gas, to remove oxygen and humidity, as desired, and then the housing 12 is pressurized to above the normal (i.e. standard) atmospheric pressure. This is done to impede the flow of air or excess humidity back into the housing. In one embodiment the housing 12 is pressurized at 18 PSIA using dry nitrogen. In an embodiment, the housing wails will be strong enough so be capable of withstanding a pressure differentials across the walls of up to at least 25 PSID.

The electronics unit 14 may be secured in the housing, and the housing is secured to appropriate aircraft structure 20, such as an aircraft engine. Also, the aircraft electronics assembly 10 may include a suitable pressure relief device, to prevent excessive pressure from building up inside the housing 12 that could cause it to burst.

Figure 2:
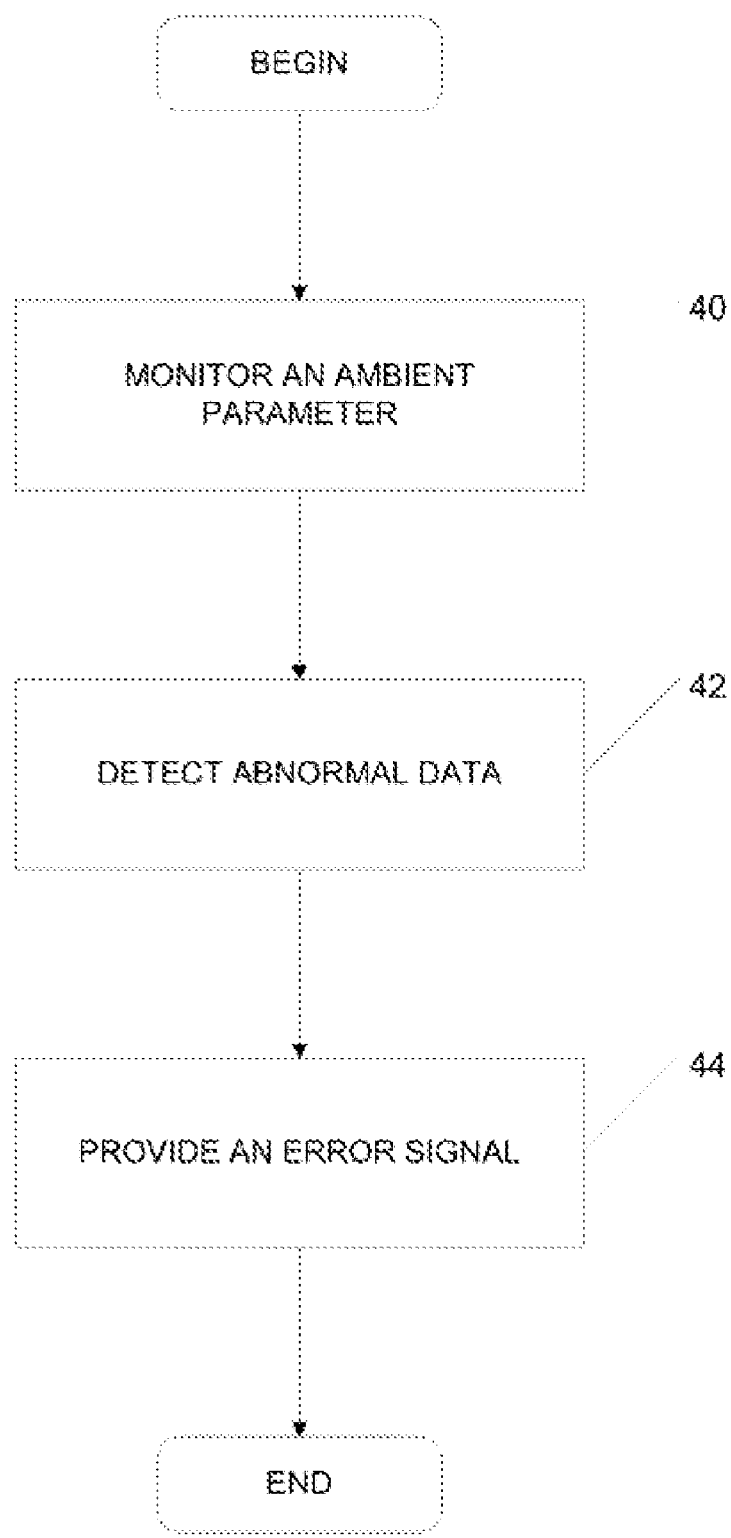
FIG. 2 is a flowchart showing how the pressurised electronics housing is monitored according to one embodiment; according to a first step an ambient parameter is monitored, according to a second step, abnormal data is detected and according to a third step an error signal is provided.

Now referring to FIG. 2, there is shown method for monitoring the electronics housing.

According to step 40, an ambient parameter is monitored. In one embodiment, the pressure inside the housing is monitored. Alternatively, the temperature inside the housing is monitored. In a further embodiment, both temperature and pressure inside the housing are monitored. In other embodiments, humidity or molecular content of the gas inside the housing may be measured.

According to step 42, the parameter is compared against at least one reference value, and deviations indicating abnormal data of the monitored ambient parameter are thereby detected.

According to step 44, an error signal is provided in the case when abnormal data is detected. The signal may be provided to the aircraft user (e.g., the pilot), or to a person or system monitoring the aircraft or engine systems on the user's behalf. The error signal may be provided as a maintenance flag, indicating a maintenance condition which requires a specified maintenance action within a specified period. The maintenance flag may be a binary flag ('on' or 'off'), or instead may indicate trend information reflective of the severity of the abnormal condition. For example a slight parameter change may indicate a relatively minor problem, and hence the setting of a first maintenance flag, while a more drastic parameter change may indicate a more serious problem, and hence the setting of a second maintenance flag, for example requiring more urgent attention than the first.

Figure 3:
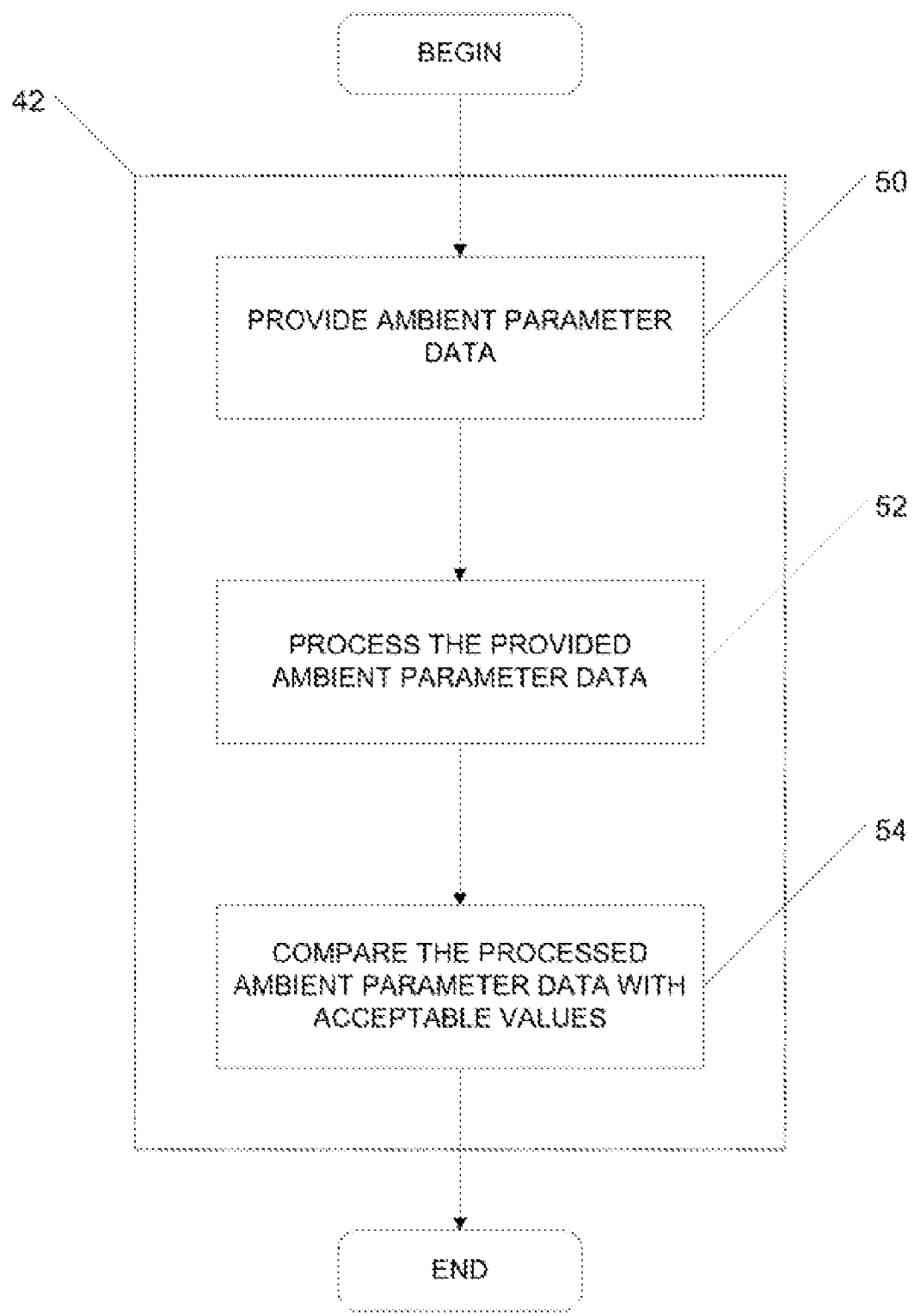
FIG. 3 is a flowchart showing how abnormal data is detected according to one embodiment.

Now referring to FIG. 3, there is shown a method for detecting abnormal data.

According to step 50, ambient parameter data is obtained.

According to step 52, the ambient parameter data is provided to a monitoring or control unit 24 for processing. The skilled addressee will appreciate that the ambient parameter data may be processed according to various strategies. For example, the pressure data may be corrected based on the internal temperature since this will affect the internal pressure. Alternatively, specific operations may be performed on the data such as for instance computing the derivative value of the ambient parameter data. The skilled addressee will appreciate that the processing of the ambient parameter data depends on the monitored ambient parameter as well as on the monitoring unit being used.

According so step 54, the processed ambient parameter data is compared with reference or acceptable value (s). The acceptable value(s) depends on various parameters such as for instance, the initial conditions during the pressurization of the housing, and/or the acceptable range of conditions in which the contents of housing 12 axe certified to operate. For instance, in the case where the monitored ambient parameter is pressure and the housing is pressurized initially at a pressure higher that the Mean Sea Level Pressure (i.e. 14.7 PSIA), the reference threshold may be include a lower threshold of, say, 10 PSIA, as a value indicative of a pressure leak in the housing for which an error signal is to be sent.

The skilled addressee will further appreciate that a combination of parameters, such as pressure and temperature, may be used to detect abnormal conditions. In the case where the housing is properly sealed, the value of the pressure divided by the value of the temperature is a constant. A leak may therefore foe detected by monitoring parameters indicative of the combination of two or more parameters, such as temperature and pressure.

The embodiments disclosed herein enable the certification as flightworthy of electronic components which are not otherwise certifiable for use in an aircraft or other airborne environment. By encapsulating them in a the present housing components, such as plastic packaged devices, intended solely for ground-based use and that would normally not be certifiable for use in cyclic pressure or cyclic humidity environments may be used.

The embodiments of the invention described above are intended to be exemplary only, and one skilled in the art will recognise that changes may be made without departing from the scope of the invention disclosed. For example, any suitable ambient parameters may be monitored in airy suitable fashion to achieve the result taught herein. The housing may have any suitable configuration. Still other modifications which fall within the scope of the present invention will be apparent to those skilled in the art, in light of a review of this disclosure, and the scope of the invention is therefore intended to be limited solely by the scope of the appended claims.

I claim:

1. A method for monitoring an aircraft-mounted electronics assembly, said method comprising:
   a. monitoring an ambient parameter inside a pressure-sealed housing of said aircraft-mounted electronics assembly;
   b. detecting abnormal data of the monitored ambient parameter; and
   c. providing an error signal indicative of said detected abnormal data.

2. The method of claim 1, wherein said monitoring comprises monitoring at least one of temperature, pressure, humidity, and gas molecular content.

3. The method of claim 1, further comprising exchanging heat between inside and outside said assembly.

4. The method of claim 1, further comprising controlling said exchanging of heat using the ambient parameter.

5. The method of claim 1, wherein said providing an error signal comprises providing the error signal to at least one of an aircraft user, and a person or system monitoring the aircraft or engine systems.

6. The method of claim 1, said providing an error signal comprises providing a maintenance flag indicating a maintenance condition which requires a specified maintenance action within a specified period.

7. The method of claim 1, further comprising correcting said ambient parameter based on another ambient parameter.

8. The method of claim 1, wherein said detecting abnormal data comprises said ambient parameter with a reference value.

* * * * *